(12) United States Patent
Umeyama et al.

(10) Patent No.: US 9,002,035 B2
(45) Date of Patent: Apr. 7, 2015

(54) GRAPHICAL AUDIO SIGNAL CONTROL

(75) Inventors: Yasuyuki Umeyama, Hamamatsu (JP); Kazunobu Kondo, Hamamatsu (JP); Yu Takahashi, Hamamatsu (JP); Jordi Bonada, Barcelona (ES); Jordi Janer, Vilafranca (ES); Ricard Marxer, Barcelona (ES)

(73) Assignee: Yamaha Corporation, Hamamatsu-shi (JP)

( * ) Notice: Subject to any disclaimer, the term of this patent is extended or adjusted under 35 U.S.C. 154(b) by 370 days.

(21) Appl. No.: 13/367,696

(22) Filed: Feb. 7, 2012

(65) Prior Publication Data

US 2012/0201385 A1      Aug. 9, 2012

(30) Foreign Application Priority Data

Feb. 8, 2011   (JP) .................................. 2011-025402

(51) Int. Cl.
*H04B 1/00*      (2006.01)
*G11B 20/10*     (2006.01)
(Continued)

(52) U.S. Cl.
CPC .......... *G11B 20/10527* (2013.01); *H03G 5/005* (2013.01); *H03G 5/165* (2013.01); *H03G 5/18* (2013.01); *H04S 7/307* (2013.01); *G11B 2020/10564* (2013.01); *G11B 2020/10574* (2013.01); *H04S 7/40* (2013.01); *H04R 2430/01* (2013.01); *H04S 2400/13* (2013.01);
(Continued)

(58) Field of Classification Search
CPC .................................. H04B 1/00; H03G 3/00
USPC ............... 381/306, 104–109, 119, 1, 103, 61
See application file for complete search history.

(56) References Cited

U.S. PATENT DOCUMENTS 5,812,688 A      9/1998   Gibson
6,490,359 B1 *   12/2002  Gibson ......................... 381/119
(Continued)

FOREIGN PATENT DOCUMENTS

EP      1 786 240 A2    5/2007
JP      4-296200 A      10/1992
(Continued)

OTHER PUBLICATIONS

Barry D et al: "Sound Source Separation: Azimuth Discrimination and Resynthesis", Proceedings of the International Conference on Digital Audioeffects, Oct. 5, 2004, pp. DAFX.1-DAFX.5, XP002340068.

(Continued)

*Primary Examiner* — Disler Paul
(74) *Attorney, Agent, or Firm* — Crowell & Moring LLP

(57) ABSTRACT

Signal processing section of a terminal converts acquired audio signals of a plurality of channels into frequency spectra set, calculates sound image positions corresponding to individual frequency components, and displays, on a display screen, the calculated sound image positions results by use of a coordinate system having coordinate axes of the frequency components and sound image positions. User-designated partial region of the coordinate system is set as a designated region and an amplitude-level adjusting amount is set for the designated region, so that the signal processing section adjusts amplitude levels of frequency components included in the frequency spectra and in the designated region, converts the adjusted frequency components into audio signals and outputs the converted audio signals.

30 Claims, 11 Drawing Sheets

(51) Int. Cl.
  *H03G 5/00* (2006.01)
  *H03G 5/16* (2006.01)
  *H03G 5/18* (2006.01)
  *H04S 7/00* (2006.01)

(52) U.S. Cl.
  CPC .......... *H04S2420/07* (2013.01); *H04S 7/305* (2013.01); *G10H 2210/305* (2013.01); *G10H 2220/116* (2013.01); *G10H 2250/235* (2013.01)

(56) References Cited

U.S. PATENT DOCUMENTS

| | | | |
|---|---|---|---|
| 8,124,864 B2 | 2/2012 | Sato et al. | |
| 8,129,606 B2 | 3/2012 | Sato et al. | |
| 8,207,439 B2 | 6/2012 | Sato et al. | |
| 8,213,648 B2* | 7/2012 | Kimijima | 381/310 |
| 8,311,238 B2* | 11/2012 | Kimijima | 381/94.3 |
| 2006/0064300 A1 | 3/2006 | Holladay | |
| 2007/0021959 A1 | 1/2007 | Goto | |
| 2007/0110258 A1 | 5/2007 | Kimijima | |
| 2008/0019531 A1 | 1/2008 | Kimijima | |
| 2008/0130918 A1* | 6/2008 | Kimijima | 381/107 |
| 2010/0251168 A1 | 9/2010 | Fujita et al. | |
| 2011/0150247 A1* | 6/2011 | Oliveras | 381/304 |

FOREIGN PATENT DOCUMENTS

| | | | |
|---|---|---|---|
| JP | 2005-49364 A | 2/2005 | |
| JP | 2005-244293 A | 9/2005 | |
| JP | 2005-301827 A | 10/2005 | |
| JP | 2007-135046 A | 5/2007 | |
| JP | 3912386 B2 | 5/2007 | |
| JP | 2008-28700 A | 2/2008 | |
| JP | 2008-42721 A | 2/2008 | |
| JP | 2009-188971 A | 8/2009 | |
| JP | 4462350 B2 | 5/2010 | |
| JP | 2010-231432 A | 10/2010 | |
| JP | 2011-120116 A | 6/2011 | |
| JP | 4840423 B2 | 12/2011 | |
| WO | WO 2005/101898 A2 | 10/2005 | |

OTHER PUBLICATIONS

Bonada Jordi et al: "Demixing Commercial Music Productions via Human-Assisted Time-Frequency Masking" AES Convention 120; May 2006, AES, 60 East 42nd Street, Room 2520 New York 10165-2520, USA, May 1, 2006, pp. 1-9, XP040507613.

Avendano C: "Frequency-domain source identification and manipulation in stereo mixes for enhancement, suppression and re-panning applications", Applications of Signal Processing to Audio and Acoustics, 2003 IEEE Workshop on. New Paltz, NY, USA Oct. 19-22, 2003, Piscataway, NJ, USA,IEEE, Oct. 19, 2003, pp. 55-58, XP010696451.

Partial European Search Report dated Apr. 26, 2012 (eight (8) pages).

Extended European Search Report dated Aug. 17, 2012 (twenty-three (23) pages).

Japanese Office Action dated Oct. 21, 2014, including English translation (seven (7) pages).

\* cited by examiner

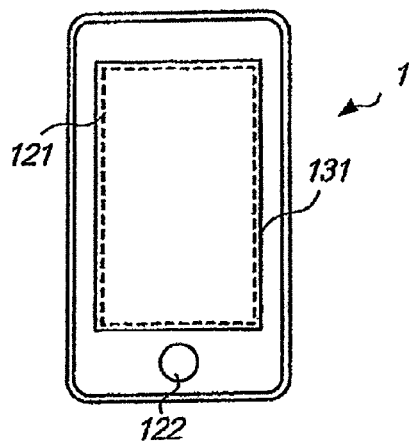
F I G. 1
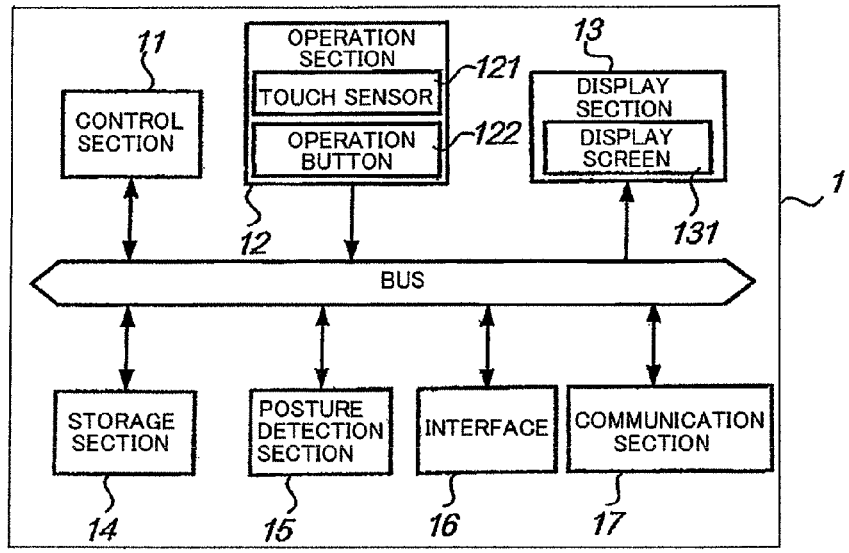
F I G. 2

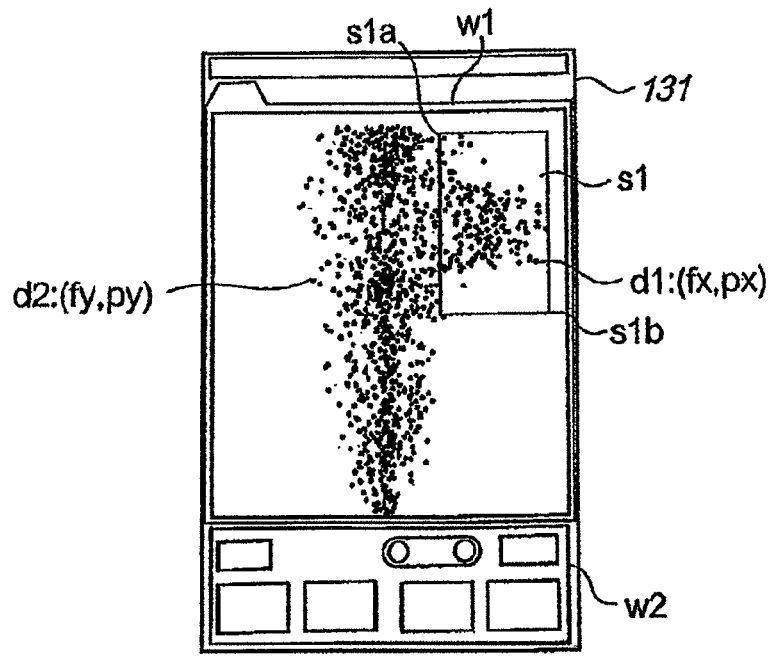
F I G. 5 A
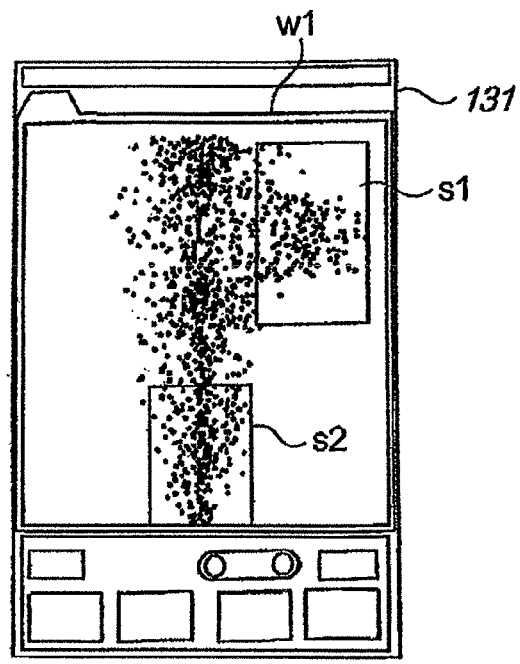
F I G. 5 B

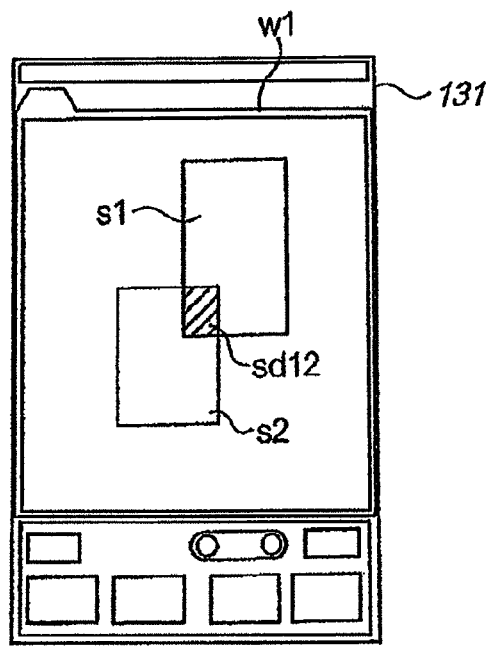
F I G. 7
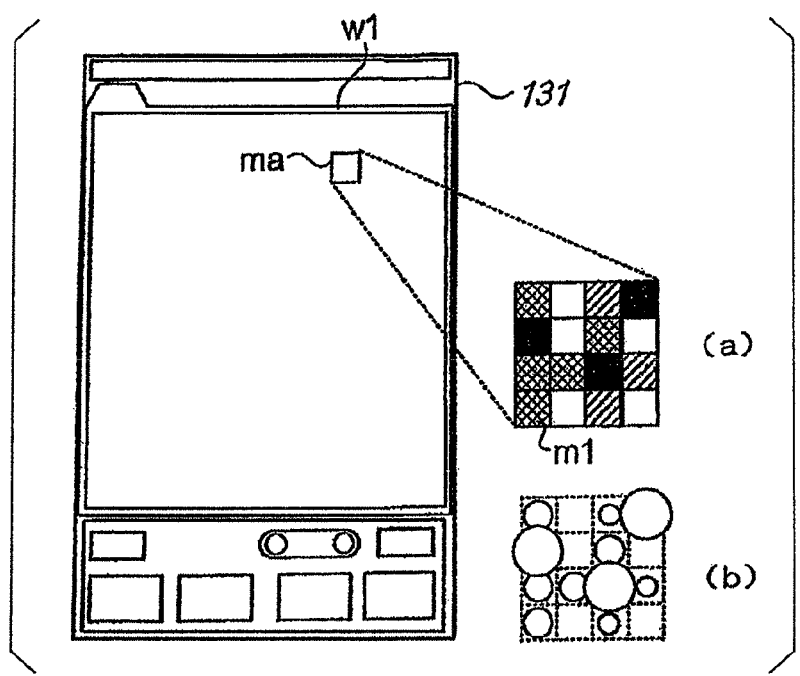
F I G. 8

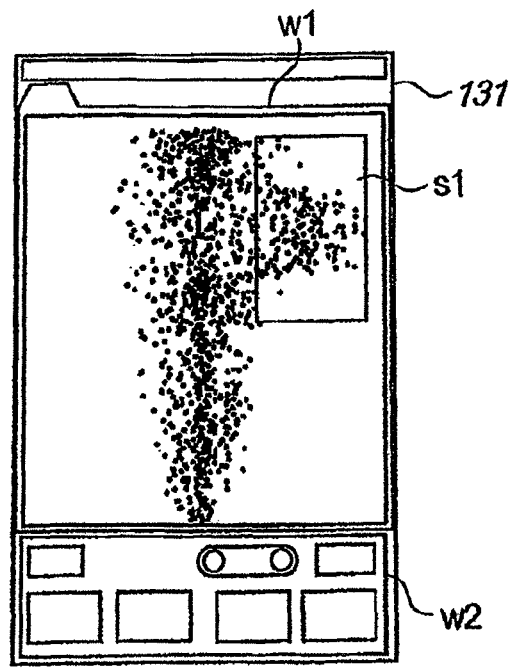
F I G. 9 A
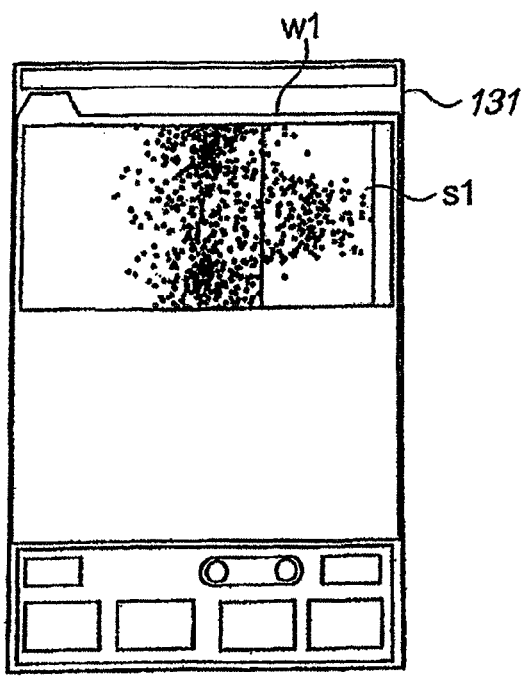
F I G. 9 B

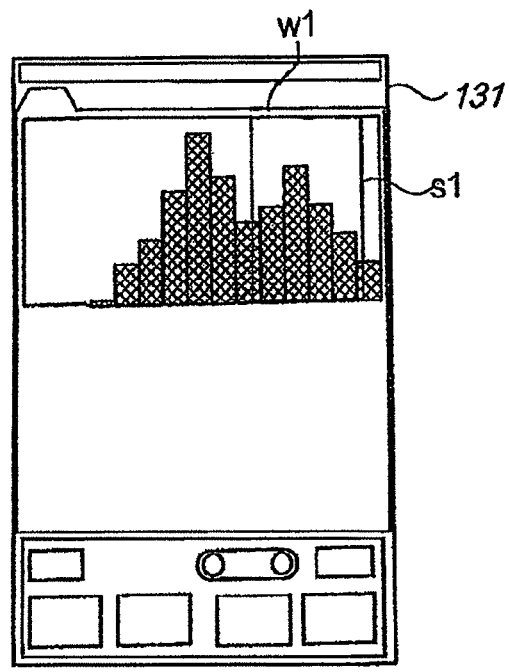
F I G. 1 0 A
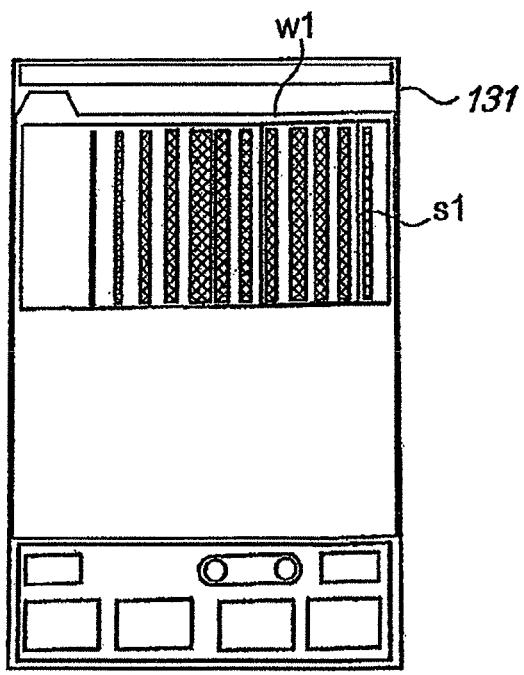
F I G. 1 0 B

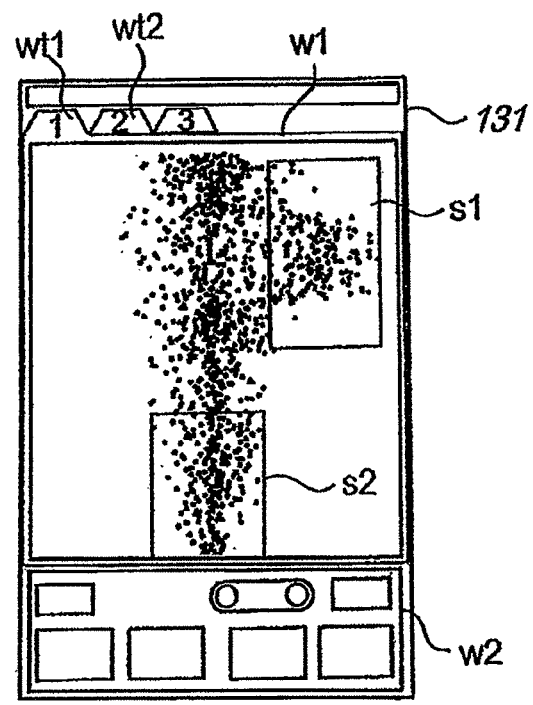
F I G. 1 1 A
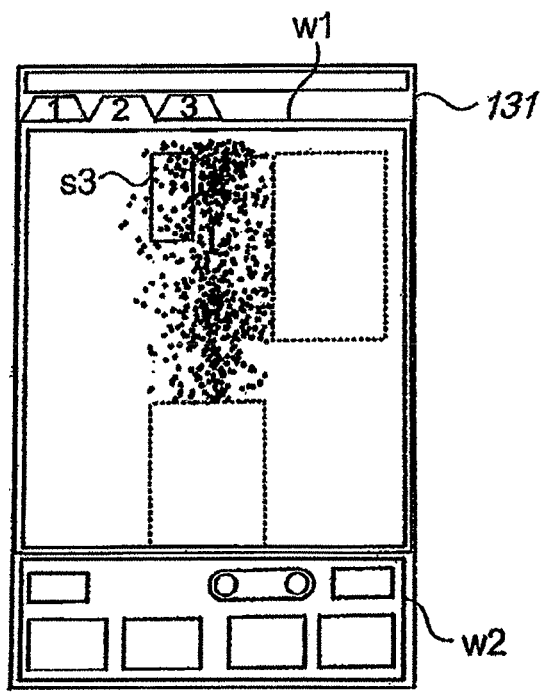
F I G. 1 1 B

GRAPHICAL AUDIO SIGNAL CONTROL

BACKGROUND

The present invention relates to techniques for performing signal processing on audio signals, and more particularly to graphical audio signal control.

In the field of stereo audio signal processing, a technique has heretofore been developed which is capable of displaying sound image positions on a frequency-band-by-frequency-band basis, as disclosed for example in Japanese Patent No. 3912386. With such a technique, it is possible to know in detail sound image positions of sounds represented by stereo audio signals.

When level adjustment of audio signals is to be performed on the frequency-band-by-frequency-band basis, graphic equalizers etc. are employed. However, although the use of the graphic equalizer can adjust level adjustment frequency band by frequency band, all of sound signal levels in a particular frequency band would be adjusted, and thus, it is not possible to adjust a level of a sound having a particular sound image position.

Further, among the graphic equalizers are ones capable of performing level adjustment independently for individual ones of stereo left (L) and right (R) channels. However, even with such a graphic equalizer, when a signal level of only the L channel has been lowered for a particular frequency band, a signal level of the R channel would rise relatively for that particular frequency band, so that the sound image position would move as a whole to the R channel side. Thus, even with the graphic equalizer, a sound having a particular sound image position could not be adjusted in level.

SUMMARY OF THE INVENTION

In view of the foregoing prior art problems, it is an object of the present invention to perform signal processing on audio signals such that adjustment is made on levels of sounds having a particular one of relationship, in frequency-dependent feature amount, between a plurality of channels.

In order to accomplish the above-mentioned object, the present invention provides an improved signal processing apparatus, which comprises: an acquisition section which acquires audio signals of individual ones of a plurality of channels; a first conversion section which converts the audio signal of each of the channels, acquired by the acquisition section, into a frequency spectra set of the channel; a calculation section which extracts frequency-dependent feature amounts from the acquired audio signals and calculates, in correspondence with each frequency component, a relation value corresponding to relationship in the feature amount between the channels; a display control section which displays results of calculation by the calculation section by use of a coordinate system having a frequency coordinate axis and a coordinate axis of the relation value; a region setting section which sets a partial region of the coordinate system as a designated region; an adjusting amount setting section which sets a level adjusting amount for the designated region; a level change section which extracts, from the results of calculation, frequency components included in the designated region and changes amplitude levels of the extracted frequency components of the frequency spectra in accordance with the adjusting amount; and a second conversion section which synthesizes the frequency spectra, having been changed in the amplitude level by the level change section, for each of the channels and converts the synthesized frequency spectra into an audio signal of the channel.

Preferably, in the signal processing apparatus of the present invention, the region setting section sets a plurality of regions as a plurality of the designated regions, and the adjusting amount setting section sets the adjusting amounts for individual ones of the plurality of the designated regions. If there is an overlapping region that overlaps the plurality of the designated regions, the level change section changes amplitude levels of frequency components, included among the extracted frequency components and included in the overlapping region, in accordance with an amount determined on the basis of at least one of the adjusting amounts set for the individual designated regions constituting the overlapping region.

Preferably, the level change section changes the amplitude levels of the frequency components, included in the overlapping region, in accordance with an amount determined by the adjusting amounts set for the individual designated regions and content of the results of calculation included in the individual designated regions.

Preferably, the level change section changes the amplitude levels of the frequency components, included in the overlapping region, in accordance with an amount determined by the adjusting amounts set for the individual designated regions and relationship between respective sizes of the designated regions.

Preferably, the adjusting amount setting section sets the adjusting amount such that the adjusting amount differs depending on positions within the designated region.

The present invention arranged in the aforementioned manner can perform signal processing on audio signals such that adjustment is made on levels of sounds having a particular one of relationship, in frequency-dependent feature amount, between the plurality of channels.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which:

FIG. 1 is a view explanatory of an outer appearance of a terminal employed in a preferred embodiment of the present invention;

FIG. 2 is a block diagram explanatory of a construction of the terminal employed in the embodiment of the present invention;

FIGS. 5A and 5B are diagram explanatory of an example display on a display screen having a designated region displayed thereon in the embodiment of the present invention;

FIG. 7 is a diagram explanatory of a designated region in modification 2 of the present invention;

FIG. 8 is a diagram explanatory of example displays on the display screen in modification 3 of the present invention;

FIGS. 9A and 9B are diagrams explanatory of an example display on the display screen when a designated region is to be designated in modification 4 of the present invention;

FIGS. 10A and 10B are diagrams explanatory of other examples display on the display screen when a designated region is to be designated in modification 4 of the present invention;

FIGS. 11A and 11B are diagrams explanatory of example displays on the display screen in modification 3 of the present invention;

DETAILED DESCRIPTION OF THE INVENTION

<Embodiment>

Figure 3:
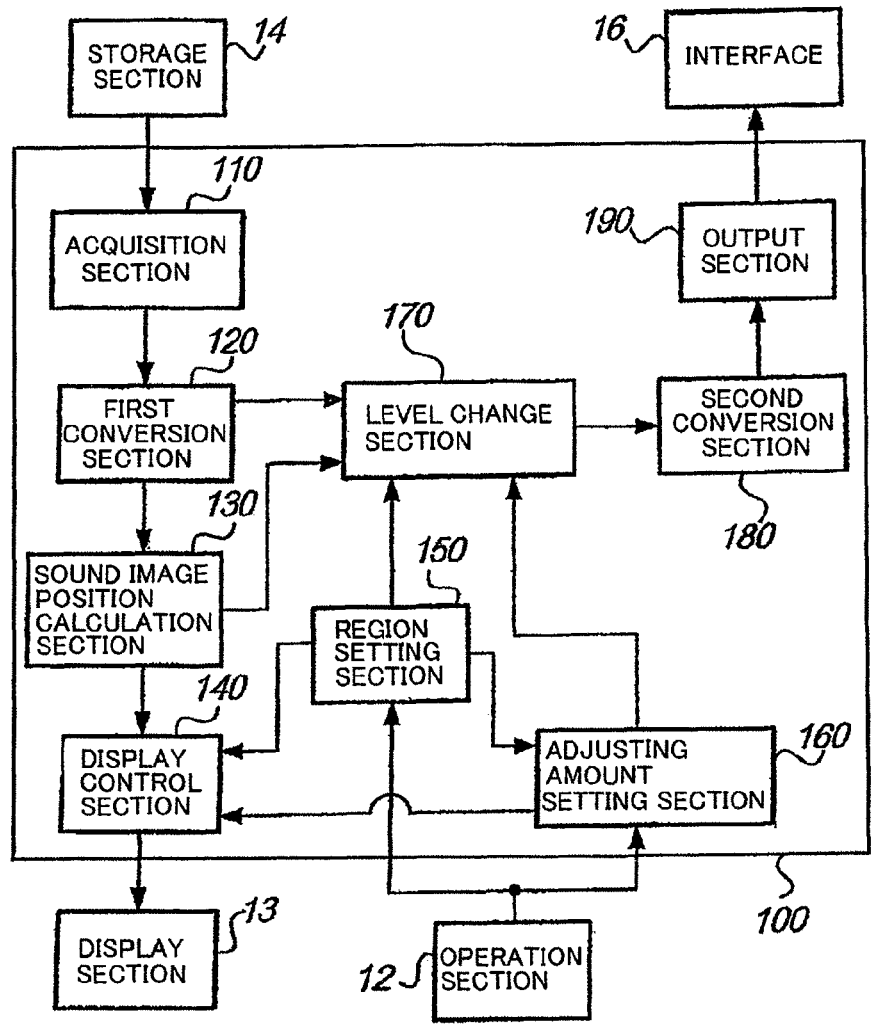
FIG. 3 is a block diagram explanatory of arrangements of signal processing functions performed in the embodiment of the present invention.

Construction of Terminal 1:

FIG. 1 is a view explanatory of an outer appearance of a terminal 1 employed in a preferred embodiment of the present invention. The terminal 1 is in the form of a portable information processing terminal, such a portable telephone, PDA (Personal Digital Assistant) or music player. Note that the terminal 1 may be a personal computer or the like rather than being limited to a portable information processing terminal.

As shown in FIG. 1, the terminal 1 includes, on the front surface of its casing, a transparent touch sensor 121, an operation button 122, and a display screen 131 having a graphic display function. The transparent touch sensor 121 is provided over the front surface of the display screen 131 and constitutes a touch panel in conjunction with the display screen 131. Although only one operation button 122 is shown in FIG. 1, a plurality of such operation buttons 122 may be provided.

FIG. 2 is a block diagram explanatory of a construction of the terminal 1 employed in the embodiment of the present invention. The terminal 1 includes a control section 11, an operation section 12, a display section 13, a storage section 14, a posture detection section (posture detector) 15, an interface 16, and a communication section 17. These components 11 to 17 are interconnected via a bus.

The control section 11 includes a CPU (Central Processing Unit), a RAM (Random Access memory), a ROM (Read-Only Memory), etc. The control section 11 controls various sections of the terminal 1 via the bus by executing a control program stored in the ROM or storage section 14. In the illustrated example of FIG. 2, the control section 11 executes the control program to perform various functions, such as a signal processing function for performing designated signal processing on audio signals. Whereas, in the illustrated example of FIG. 2, the various functions include functions possessed by a conventional portable telephone, PDA, music player etc., these functions need not necessarily be included.

The operation section 12 includes the touch sensor 121 and operation button 122, each of which is operable by a user and outputs operation information, indicative of content of the user's operation, to the control section 11. The touch sensor 121 is a so-called multi-touch sensor which detects a plurality of simultaneous touches. Let it be assumed here that instructions are given through user's operation performed via the operation section 12, unless stated otherwise.

The display section 13 is a display device including the display screen 131, such as a liquid crystal display (LED), and it displays, on the display screen 131, various content under control of the control section 11. When the signal processing function is ON, a display related to audio signals to be processed, a display for designating content of the signal processing, etc. are presented on the display screen 131.

The storage section 14 is a storage medium, such as a hard disk, nonvolatile memory and/or the like. The storage section 14 includes an area where audio signals of a plurality of channels indicative of content of music pieces, etc. are stored. In the illustrated example, the plurality of channels are two stereo two channels, i.e. L (left) and R (right) channels.

The posture detection section 15, which includes an acceleration sensor, an angle sensor, etc., detects movement or motion of the casing of the terminal 1 to output a motion signal.

The interface 16 includes terminals connectable with external devices to input and output various information, such as audio signals, from and to the external devices. Among the terminals are terminals connectable with sounding (audible generation) means, such as headphones and/or speakers, to supply audio signals to the sounding means.

The communication means 17 performs communication in a wireless or wired fashion with another device under control of the control section 11.

The foregoing has been a description about a hardware construction of the terminal 1.

Functional Arrangements:

The following describe the signal processing function performed by the control section 11 of the terminal 1 executing the control program. Some or all of arrangements of a signal processing section 100 that performs the signal processing function may be implemented by hardware.

FIG. 3 is a functional block diagram explanatory of functional arrangements of the signal processing function in the instant embodiment. The signal processing section 100 that performs the signal processing function includes an acquisition section 110, a first conversion section 120, a sound image position calculation section 130, a display control section 140, a region setting section 150, an adjusting amount setting section 160, a level change section 170, a second conversion section 180, and an output section 190.

The acquisition section 110 acquires, from among audio signals stored in the storage section 14, audio signals of a music piece designated by the user and outputs the acquired audio signals to the first conversion section 120. Note that the acquisition section 110 may acquire, from an external device, audio signals input via the interface 16.

The first conversion section 120 performs FFT (Fast Fourier Transform) on the audio signal of the L and R channels output from the acquisition section 110, per frame of a predetermined time length, to convert the audio signals into a set of frequency spectra. The set of frequency spectra represents correspondence relationship between frequency values (or frequency components)(f1, f2, . . . , fn) and amplitude levels (magnitudes) (A1, A2, . . . , An); namely, the frequency spectra set represents frequency dependency of amplitude levels of the audio signals. Namely, an amplitude level of each of the frequency values extracted from the audio signal is an example of a frequency-dependent feature amount.

Here, the amplitude levels (magnitudes) of the frequency spectra converted from the L-channel audio signal are represented by (AL1, Al2, . . . , ALn), while the amplitude levels (magnitudes) of the frequency spectra converted from the R-channel audio signal are represented by (AR1, AR2, . . . , ARn).

The first conversion section 120 outputs the set of frequency spectra of each of the channels, thus obtained per frame, to the sound image position calculation section 130 and level change section 170.

On the basis of the frequency spectra output from the first conversion section 120, the sound image position calculation section 130 calculates a sound image position as a relation value indicative of amplitude relationship between the channels for each of the frequency values (frequency components). Namely, in correspondence with each of the frequency values (frequency components), the sound image position calculation section 130 calculates a sound image position Pi (i=1−n) by the following mathematical expression (1) using an amplitude level (output level) ratio between the channels:

$$Pi = 2/\pi \times \arctan(ARi/ALi) \tag{1}$$

The sound image position Pi closer in value to "0" indicates that the sound image is located more on the L-channel side (left side as viewed from the user) or located closer to the leftmost end, while the sound image position Pi closer in value to "1" indicates that the sound image is located more on the R-channel side (right side as viewed from the user) or located closer to the rightmost end. Further, if the sound image position Pi is "0.5", it indicates that the sound image is located centrally between the L channel and the R channel.

In the aforementioned manner, the sound image position calculation section 130 calculates correspondence relationship between the frequency values (f1, f2, . . . , fn) and the sound image positions (P1, P2, . . . , Pn) and outputs the calculated correspondence relationship to the display control section 140 and the level change section 170 as information indicative of results of sound image calculation (hereinafter referred to also as "sound image calculation results") corresponding to individual frames. Note that the sound image positions may be calculated using any other suitable calculation method than the aforementioned as long as the other calculation method calculates sound image positions in accordance with amplitude level relationship between the channels.

The display control section 140 displays, on the display screen 131 of the display section 13, content based on the results of sound image calculation by the sound image position calculation section 130. Example display presented on the display screen 131 will be described below with reference to FIG. 4.

Figure 4A:
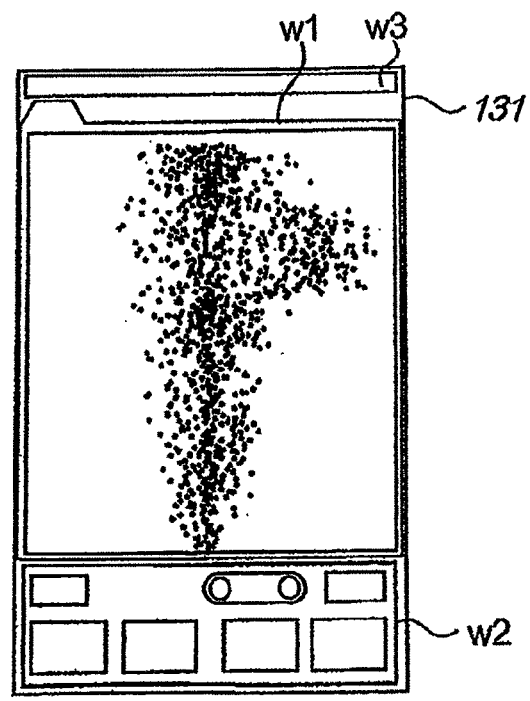
FIGS. 4A and 4B are diagram explanatory of an example display on a display screen in the embodiment of the present invention.

FIG. 4 is a diagram explanatory of the display presented on the display screen 131 in the instant embodiment. As shown in FIG. 4A, the display control section 140 controls the display section 13 to display windows w1, w2 and w3 on the display screen 131. More specifically, the display control section 140 displays, on the window w1, content based on the sound image calculation results, displays, on the window w2, various designating and instructing operation buttons, and displays, on the window w3, information related to the content displayed on the display screen 131 (e.g., music piece name).

Figure 4B:
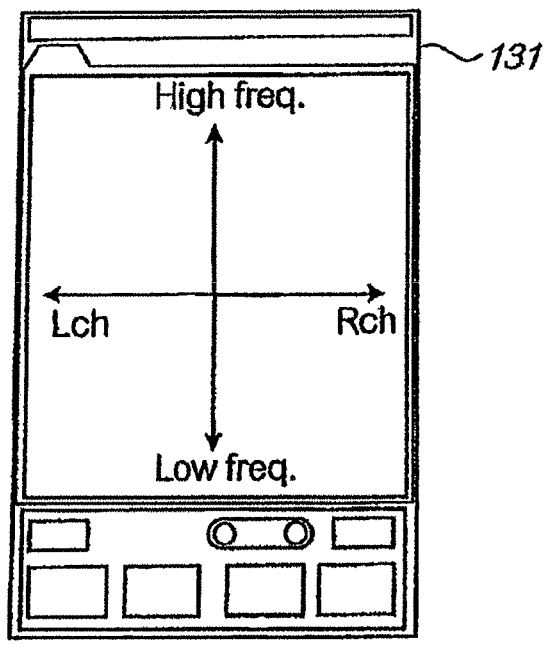

On the window w1 is presented a display obtained by plotting the sound image calculation results in a coordinate system having coordinate axes shown in FIG. 4B. More specifically, the sound image calculation results are each displayed on the window w1 in a dot in such a manner as to identify a coordinate position (X-Y value) determined by a frequency value (Y-axis value) of each frequency component and a relation value, i.e. sound image position (X-axis value), corresponding to the frequency value. A vertical coordinate axis of the window w1 represents the frequencies (higher positions along the vertical coordinate axis represent higher frequency values), while a horizontal coordinate axis of the window w1 represents the sound image positions. The example display of the sound image calculation results presented on the window w1 shown in FIG. 4A indicates the sound image calculation results of a particular frame. Such sound image calculation results are obtained frame by frame and thus vary in accordance with the passage of time.

The user perceives as if not only sound images of sounds corresponding to the display shown in FIG. 4A are localized generally centrally but also other sound images are localized more on the R channel side (closer to the rightmost end) in a high frequency band range.

Note that the display control section 140 may change a display style of the individual dots, indicative of sound image calculation results (i.e., frequencies and sound image positions), displayed on the window w1, while reflecting the amplitude levels (magnitudes). What may be changed like this is at least one of lightness, colorfulness, brightness, dot size and the like. In this case, the sound image position calculation section 130 may further control each of the sound image calculation results to include information indicative of an absolute value of the amplitude levels, such as a sum of the amplitude levels (ALS+ARi) and output the thus-controlled sound image calculation results to the display control section 140.

Further, whereas the display control section 140 has been described above as using dots as symbolic images or graphics indicative of the sound image calculation results, such symbolic graphics are not limited to dots. Namely, the sound image calculation results may be displayed using symbolic graphics of various styles; for example, they may be displayed in lines, particular marks or the like, or by displaying an area inside surrounding frames of the window w1 in gradation in accordance with the amplitude levels.

Furthermore, the display control section 140 may display the coordinate axes shown in FIG. 4B, together with the sound image calculation results shown in FIG. 4A.

Referring back to FIG. 3, the region setting section 150 sets, as a designated region, a part of a region indicated by the coordinate system displayed on the window w1 of the display screen 131, in accordance with operation information output from the operation section 12. The designated region is a region for extracting therefrom frequency values (frequency components) to be subjected to a process for changing the amplitude levels and for setting a frequency range (hereinafter referred to as "designated frequency range") and sound image position range (hereinafter referred to as "designated sound image range"). The region setting section 150 outputs designated region information, indicative of the set designated region, to the display control section 140 and level change section 170.

The display control section 140 acquires the designated region information output from the region setting section 150 and displays the designated region on the window w1 of the display screen 131. The following describe, with reference to FIG. 5, example displays presented when a partial region in the coordinate system has been set as the designated region while the display shown in FIG. 4A is being presented on the display section 131.

FIGS. 5A and 5B are explanatory of example displays presented on the display screen 131 having the designated region displayed thereon in the instant embodiment. More specifically, FIG. 5A shows a state where the designated region s1 has been set on the window w1. More specifically, once the user operates a predetermined one of various buttons on the window w2 for causing a designated region to appear and performs operation for designating a position that should become a left upper corner point s1a of a region to be designated as the designated region s1 and a right lower corner point s1b of a region to be designated as the designated region s1 (e.g., operation for touching these positions), the region setting section 150 sets the thus-designated region as the designated region s1, in response to which the display control section 140 displays the designated region s1 on the display section 131.

As an alternative, the region setting section 150 may set a plurality of regions as designated regions s1 and s2 as shown in FIG. 5B rather than setting only one region as the designated region s1 as shown in FIG. 5A. Note that the aforementioned user's operation performed for the region setting section 150 to set a part of the coordinate system as the designated region is merely illustrative, and the designated region may be set in response to other user's operation.

Referring back again to FIG. 3, the adjusting amount setting section 160 sets an amplitude level adjusting amount in the designated regions, in accordance with the operation information output from the operation section 12. The adjusting amount setting section 160 outputs, to the level change section 170, adjusting amount setting information indicative of the designated region and the adjusting amount set for the designated region. The amplitude level adjusting amount is defined as a value by which the amplitude level is to be multiplied; in the illustrated example, the adjusting amount is defined in the range of 0% to 200%.

For example, if the amplitude level adjusting amount is 100%, no amplitude level adjustment is performed in the level change section 170. If the amplitude level adjusting amount is below 100%, the adjustment is performed to reduce the amplitude level, while, if the amplitude level adjusting amount is over 100%, the adjustment is performed to increase the amplitude level. The amplitude level adjusting amount may be defined in dBs rather than in percentages, Further, the amplitude level adjusting amount may be defined as an absolute amount rather than as a relative amount. As another alternative, the amplitude level adjusting amount may be defined to adjust the amplitude values to particular output levels.

In response to the user performing operation for specifying a designated region for which amplitude level adjusting amount (hereinafter sometimes referred to simply as "adjusting amount") is to be set (e.g., operation of touching a part of the designated area on the window w1) and then designating an amplitude level adjusting amount via any of operation buttons on the window w2, the adjusting amount setting section 160 sets the adjusting amount for (to be applied to) the designated region. If the adjusting amount setting section 160 has to know the position of the designated region in order to determine whether or not the operation for specifying such a designated region has been performed, it only need to acquire the designated region information output from the region setting section 150. The aforementioned user's operation performed for the adjusting amount setting section 160 to set the adjusting amount is merely illustrative, and the adjusting amount may be set in response to other operation.

The level change section 170 compares the sound image calculation results and the designated region information to extract frequency values corresponding to the sound image calculation results included in the designated region. More specifically, the level change section 170 references the sound image calculation results to extract frequency values included in the designated frequency range from among frequency values corresponding to sound image positions included in the designated sound image range. In the illustrated example of FIG. 5A, a dot d1 (fx, Px) of the sound image calculation results is included in the designated region, but a dot d2 (fy, Py) of the sound image calculation results is not included in the designated region. Thus, the level change section 170 does not extract the frequency value fy although it extracts the frequency value fx.

Then, the level change section 170 increases or decreases, by an adjusting amount represented by the adjusting amount setting information, amplitude levels (output levels) included in the frequency spectra output from the first conversion section 120 and corresponding to the extracted frequency values (sounds generated on the basis of the amplitude levels corresponding to the frequency values will hereinafter be referred to as "sounds included in the designated region"). In the illustrated example of FIG. 5A, if the adjusting amount set for the designated region s1 is Z %, the level change section 170 changes amplitude levels of sounds, included in the designated region s1 of the frequency spectra, to Z/100 times for each of the channels. Namely, of the frequency spectra output from the first conversion section 120, values corresponding to the dot d1 are L-channel(fx, ALx) and R-channel(fx, ARx), in which case the level change section 170 changes the values L-channel(fx, ALx) and R-channel(fx, ARx) to values L-channel(fx, ALx×Z/100) and R-channel(fx, ARx×Z/100). If Z=0, the sounds included in the designated region s1 will not be heard from sounds output in a later-described manner.

In correspondence with individual frames, the level change section 170 outputs, to the sound conversion section 180, frequency spectra of the individual channels where the amplitude levels of sounds included in the designated region have been changed.

The sound conversion section 180 performs IFFT (Inverse Fast Fourier Transform) on the frequency spectra of the individual channels output from the level change section 170 to convert the frequency spectra into audio signals of the individual channels. The sound conversion section 180 outputs the converted audio signals to the output section 190.

The output section 190 outputs the audio signals output from the sound conversion section 180 to the interface 16, so that the audio signals are audibly generated via sounding devices, such as speakers, connected to the interface 16.

In the aforementioned manner, the signal processing section 100 converts the acquired audio signals of the plurality of channels into frequency spectra, calculates sound image positions corresponding to individual frequencies and displays the calculated sound image positions on the display screen 131 using the coordinate system having coordinate axes of frequency and sound image position. Further, a user-designated partial region of the coordinate system is set as a designated region and an amplitude level adjusting amount is set for the designated region, so that the signal processing section 100 adjusts amplitude levels of sounds included in the designated region of the frequency spectra and converts the adjusted levels into audio signals to output the converted audio signals.

Thus, the user can intuitively designate a partial region while viewing sound image calculation results displayed on the display screen 131, and this region is set as the designated region by the region setting section 150 so that sounds included in the designated region can be increased or decreased in sound volume.

For example, if sounds represented by the audio signals are sounds obtained by stereophonically recording a performance that uses a plurality of musical instruments, the user can designate a region corresponding to sound images of a particular musical instrument so that the region is set as a designated region, and the user can also designate an adjusting amount to be applied to the designated region so that sounds of the particular musical instrument adjusted to a lower sound volume can be audibly output via speakers. Thus, the user can enjoy like in a karaoke by executing a performance of the particular musical instrument, with a low sound volume, to the output sounds. At that time, the user can also practice playing the particular musical instrument while listening to the sounds of the particular musical instrument by keeping the sounds of the particular musical instrument at an audible sound volume level rather than completely deadening the sound volume.

Conversely, the user can cause sounds of the particular musical instrument, adjusted to a higher sound volume, to be output via the speakers, by setting an adjusting amount for (to be applied to) the designated region. In this way, the user can listen to sounds of a desired musical instrument with an increased sound volume and listen in detail to sounds of a particular musical instrument.

Further, by designating regions corresponding to sound images of a plurality of musical instruments, the user can enjoy a karaoke using the plurality of musical instruments and listen to sounds of the plurality of musical instruments in enhanced volumes.

Note that adjusting amounts can be set such that sound included in one of the designated regions are increased in sound volume while sounds included in the other are decreased in sound volume. For example, by setting a great sound volume for a sound of one guitar whose sound image is localized at a leftmost position and setting a small sound volume for a similar guitar sound of another guitar whose sound image is localized a little to the right of the one guitar, the user can catch more clearly a performance of the one guitar. In this way, the user can catch more clearly a performance of one or particular musical instrument by reducing the sound volume of another musical instrument, generating a similar sound to the one or particular musical instrument, relative to the one or particular musical instrument.

<Modifications>

Whereas the preferred embodiment has been described above, the present invention may be practiced in various other manners.

<Modification 1>

Whereas the adjusting amount set by the adjusting amount setting section 160 in the preferred embodiment has been described as being the same amount everywhere throughout the designated region, different adjusting amounts may be set depending on positions in the designated region. For example, adjusting amounts may be set as shown in FIG. 6.

Figure 6A:
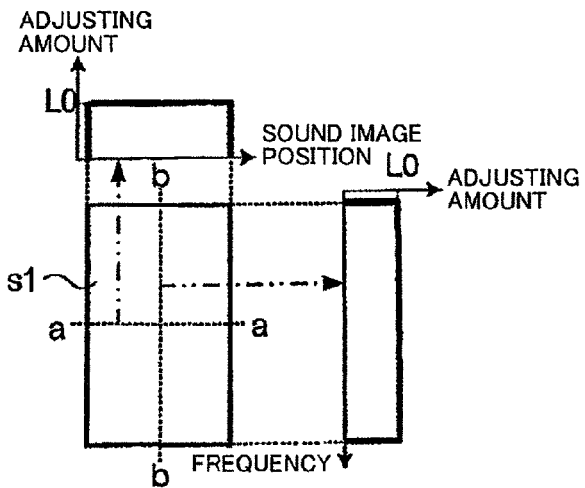
FIGS. 6A to 6C are diagrams explanatory of adjusting amounts set for a designated region in modification 1 of the present invention.
Figure 6B:
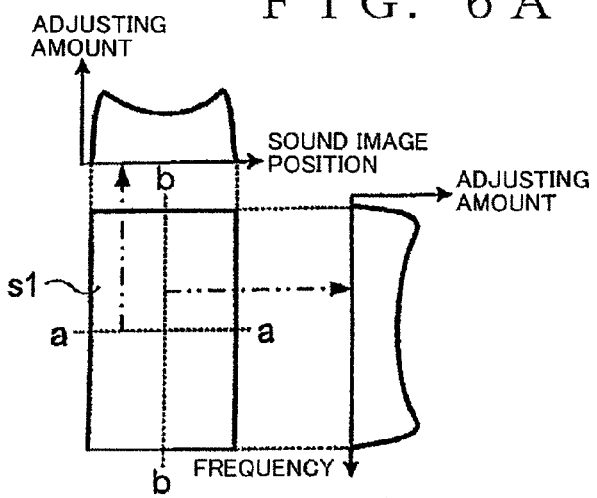
Figure 6C:
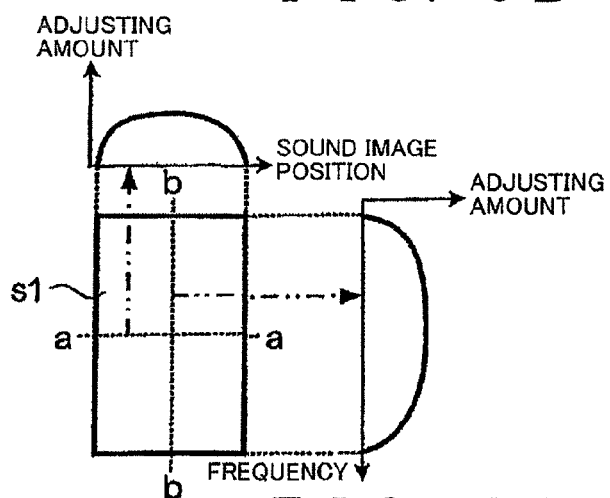

FIG. 6 is explanatory of adjusting amounts set in the designated region in modification 1 of the present invention, of which FIG. 6A is a diagram showing the adjusting amount set in the above-described embodiment, and FIG. 6B is a diagram showing the adjusting amounts set in modification 1.

In the above-described preferred embodiment, as shown for example in FIG. 6A, the adjusting amount is set at the same amount L0 at each position in both a coordinate axis direction of the sound image (a-a direction) and a coordinate axis of the frequency (b-b direction) of the designated region s1. In modification 1, however, the adjusting amount is set to vary in both the coordinate axis direction of the sound image (a-a direction) and the coordinate axis of the frequency (b-b direction) of the designated region s1. In the illustrated example of FIG. 6B, the adjusting amount is set to become smaller in a central portion of the designated region s1 than in a peripheral portion of the designated region s1; that is, the adjusting amount in the modification is set in a centrally concave shape.

In this case, the level change section 170 only has to identify adjusting amounts, corresponding to frequency values and sound image positions of sounds included in the designated region s1, in correspondence with frequency values extracted in correspondence with the designated region s1. Then, when amplitude levels corresponding to the individual frequency values of sounds included in the designated region s1 are to be changed, the level change section 170 only has to change the amplitude levels in accordance with the adjusting amounts identified in correspondence with the frequency values. In this way, the signal processing section 100 can also output sounds, included in the designated region, after adjusting volume levels of the sounds with the adjusting amounts differing in accordance with their positions within the designated region. In a case where the adjusting amounts are set in the manner as shown in FIG. 6B, the signal processing section 100 can output a sound closer to the periphery of the designated region s1 with a greater sound volume. Because the adjusting amounts only have to be set to vary in value depending on the positions within the designated region, the adjusting amounts may be set in various mariners, e.g. in such a manner that they take greater values in a central portion of the designated region than in a peripheral portion of the designated region (in a convex shape).

<Modification 2>

In the case where the region setting section 150 sets a plurality of the designated regions, a region where these designated regions partly overlap each other may also be set as a designated region. Such a modification (modification 2) will be described below with reference to FIG. 7.

FIG. 7 is a diagram explanatory of designated regions in modification 2 of the present invention. In this modification, designated regions s1 and s2 are set by the region setting section 150 in such a manner as to define an overlapping region sd12 where the designated regions s1 and s2 partly overlap each other. For sounds included in such an overlapping region sd12, the level change section 170 determines an adjusting amount corresponding to (or for) the overlapping region sd12, taking into account adjusting amounts set for the individual designated regions that define the overlapping region sd12, i.e. on the basis of at least one of the adjusting amounts set for the designated regions s1 and s2, and the level change section 170 changes amplitude levels in accordance with the thus-determined adjusting amount. The following describe example adjusting amount determination methods for determining the adjusting amount corresponding to the overlapping region sd12. Note that, in the description about modification 2, the adjusting amounts set for respective ones of the designated regions s1 and s2 are represented by reference characters L1 and L2 while the adjusting amount set for the designated region s12 is represented by reference numeral L12.

According to the first example of the adjusting amount determination method, the level change section 170 determines, as the adjusting amount L12, a value obtained by adding together the adjusting amounts L1 and L2 (sum or average value of the adjusting amounts L1 and L2). In this case, the adjusting amounts L1 and L2 may be added together after being weighted in accordance with a ratio of areas of the designated regions s1 and s2. For example, if the area of the designated region s1 is twice as large as the area of the designated region s2, then an amount twice as large as the adjusting amount L1 may be added with the adjusting amount L2. Alternatively, the adjusting amounts L1 and L2 may be added together after being weighted in accordance with content of sound image calculation results included in the designated regions s1 and s2, i.e. relationship between sounds included in the designated region s1 and in the designated region s2. For example, the adjusting amounts L1 and L2 may be weighted in accordance with a difference between sums of amplitude levels of sounds included in the individual designated regions s1 and s2 or a difference between the numbers of frequency values extracted from the individual designated regions s1 and s2. Alternatively, the level change section 170 may determine, as the adjusting amount L12, a value obtained by subtracting one of the adjusting amounts L1 and L2 from the other of the adjusting amounts L1 and L2 rather than adding together the adjusting amounts L1 and L2, or any other value obtained by any other method as long as the other value is obtained using the adjusting amounts L1 and L2.

According to the second example of the adjusting amount determination method, the level change section 170 determines, as the adjusting amount L12, either the greater or the smaller of the adjusting amounts L1 and L2. Further, according to the third example of the adjusting amount determination method, the adjusting amount L12 is determined in such a manner that it varies in accordance with positions in the overlapping region sd12 in the same manner as explained above in relation to modification 1. In such a case, the adjusting amount L12 may be varied in such a manner that it becomes closer to the adjusting amount L1 at positions within the overlapping region sd12 closer to the designated region s1 and becomes closer to the adjusting amount L2 at positions within the overlapping region sd12 closer to the designated region s2. In the case where the value of the adjusting amount L2 is varied depending on positions within the overlapping region sd12 like this, a value varying by interpolation using a linear interpolation scheme may be determined as the adjusting amount L12, or a value varying by interpolation using an interpolation curve (e.g., spline curve) may be determined as the adjusting amount L1.

The above-described methods for determining an adjusting amount L12 for the overlapping region sd12 are merely illustrative, and the adjusting amount L12 may be determined by any other adjusting amount determination method as long as the other adjusting amount determination method determines the adjusting amount L12 for the overlapping region L12 in accordance with the adjusting amounts set for the designated regions defining the overlapping region sd12. Further, whereas the examples of the adjusting amount determination method have been illustratively described in relation to the case where the overlapping region is defined by two designated regions, the overlapping region may be defined by three or more designated regions.

<Modification 3>

Whereas the display control section 140 in the above described embodiment is constructed to display, on the display w1 of the display screen 131, sound image calculation results by indicating sound image positions, corresponding to individual frequency values (frequency components), in dots, the sound image calculation results may be displayed in any other suitable display styles. FIG. 8 shows an example display style employed in modification 3 of the present invention.

FIG. 8 is a diagram explanatory of the example display presented on the display screen 131 in modification 3 of the present invention, of which (a) is a diagram showing in enlarged scale a part ma of the display window w1. As shown in (a) of FIG. 8, the display control section 140 displays segmented, meshed regions m1 on the window w1 and changes the density of a display color of each of the meshed regions m1 in accordance with sound image calculation results included in the meshed region m1. For example, the display control section 140 may change the density of the display color of the meshed region m1 in accordance with the number of frequency values included in frequencies of a range defined by the meshed region m1 among frequency values corresponding to sound image positions within the range defined by the meshed region m1, i.e. in accordance with the number of sounds (frequency components) included in the range defined by the meshed region m1. Alternatively, the display control section 140 may change the density of the display color of the meshed region m1 in accordance with amplitude levels of sounds included in the meshed region m1. Of course, such meshed regions are displayed in the remaining part of the display window rather than being displayed in the part ma alone.

As another example, images or graphics predetermined in correspondence with the individual meshed regions (in the illustrated example, circle each centered around the center of the corresponding meshed region), as shown in (b) of FIG. 8. In this case, the circle may be changed in diameter in accordance with the number of sounds included in the meshed region.

In the case where the sound image calculation results are displayed in the meshed regions as above, the region setting section 150 may set a designated region with the meshed region used as a minimum unit of the designated region.

Thus, in a case where the signal processing section 100 and the display section 13 are constructed as separate devices and information to be displayed is to be communicated (i.e., transmitted and received) between the signal processing section 100 and the display section 13, for example, the aforementioned arrangements can reduce the quantity of information to be communicated. Further, the display control section 140 can display the sound image calculation results on the display screen having a small number of pixels.

Although it is assumed here that the style for displaying the meshed regions is changed in accordance with sound image calculation results of each frame, the style for displaying the meshed regions may be changed in accordance with temporally-consecutive sound image calculation results of a plurality of frames.

<Modification 4>

In the above-described embodiment, user's designation of a region for causing the region setting section 150 to set a designated region may be performed separately in the frequency axis direction and in the sound image axis direction. In such a case, the display style of the window w1 on the display screen 131 may be changed in accordance with the axis direction designated. With reference FIG. 9, the following describe an example display on the display screen 131 when a sound image range is to be designated with the frequency axis direction, i.e. frequency value range, designated and fixed in advance.

FIG. 9 is explanatory of the example display on the display screen 131 when a designated region is to be designated in modification 4 of the present invention. FIG. 9A is a diagram showing a currently-set designated region s1. Once, in the state of FIG. 9A, the user gives an instruction for providing a construction where designation of a region only in the sound image axis direction is permitted with the frequency axis direction fixed, e.g. by operating an operation button of the window w2, the display style of the window w1 is changed by the display control section 140. In the illustrated example, the window w1 is changed to a style in which only a designated frequency range of the designated region s1 is displayed in the frequency axis direction as shown in FIG. 9B.

With such a modified display, where the display style change is limited such that the display style amount cannot be changed in the frequency axis direction from the designated frequency range in the designated region set by the region setting section 150, the user can designate a designated sound image range of the designated region s1, focusing only on the sound image position axis direction. As one example, a plurality of types of templates, each for determining a designated region having a designated frequency range predetermined therein, may be provided in advance, for example by being prestored in the storage section 140, and the user may select any one of the templates to fix the designated frequency range at the time of designating the designated region through limitations of the display by the display control section 140 and the setting by the region setting section 150. For example, a template having predetermined therein a designated frequency range corresponding to a frequency range that corresponds to a performance sound of a musical instrument may be provided in advance per type of musical instrument, in which case, by the user selecting any one of the musical instrument types, the user can determine the designated frequency range corresponding to the pitch range of the selected musical instrument.

Further, whereas the display style shown in FIG. 9B is arranged to limit the displayed content to sound image calculation results within the designated frequency range, it may be arranged in any other suitable manner.

FIG. 10 is explanatory of another example display on the display screen 131 when a designated region is to be designated in modification 4 of the present invention. More specifically, FIG. 10A shows an example in which, for the sound image calculation results displayed on the window w1 shown in FIG. 9B, sound image positions are segmented on a per-predetermined-range basis, and in which the sound image calculation results indicative of sound image positions of the individual predetermined ranges are displayed together as a histogram irrespective of frequency values. In the histogram, the horizontal axis represents the sound image positions of the individual ranges, while the vertical axis represents the numbers of the frequency values (i.e., frequency components) corresponding to the sound image positions of the individual predetermined ranges. Alternatively, the vertical axis may represent sums of amplitude levels of sounds corresponding to the sound image positions of the individual predetermined ranges. In the case where the designated frequency range is determined in advance like this, the user does not have to recognize the frequency coordinate axis, and thus, the frequency coordinate axis may be changed to an axis representing frequencies of the histogram.

Alternatively, the sound image calculation results may be displayed in a bar code format, as shown in FIG. 10B. The display style shown in FIG. 10B displays, as thicknesses of lines, values corresponding to the frequencies shown in FIG. 10A. Namely, in the case where the designated frequency range is fixed, the display style may be modified to not use the frequency coordinate axis. Whereas the above examples have been described in relation to the case where the designated frequency range is fixed, they are also applicable to a case where the designated sound image range is fixed. For example, the display style shown in FIG. 9B may be modified in such a manner as to display only the sound image calculation results included in the designated sound image range.

<Modification 5>

Whereas the preferred embodiment has been shown and described above in relation to the case where only one window w1 is displayed on the display screen 131, a plurality of windows w1 may be displayed on the display screen 131 in such a manner that switching can be made between the windows w1. An example display presented on the display screen 131 in this case will be described with reference to FIG. 11.

FIG. 11 is explanatory of the example display presented on the display screen 131 in modification 5 of the present invention. As shown in FIG. 11A, tabs wt1, wt2, . . . are provided above the window w1 for the user to select which one of the windows w1 should be displayed. In this example, the same content as in the above-described embodiment is displayed when the tab wt1 is selected. Once the user selects the tab wt2, one of the windows w1 which corresponds to the selected tab wt2 is displayed.

Namely, in this modification 5, the display control section 140 can selectively display, on the display screen 131, any one of the plurality of display windows w1. Each of the display windows w1 displays the sound image calculation results, output from the calculation section 130, in a predetermined display style as shown in FIG. 4A, 11A or 10B. With a desired one of the display windows w1 selected and displayed on the display screen 131, the region setting section 150 can set a particular designated region and the adjusting amount setting section 160 can set a particular level adjusting amount in association with the particular designated region, in generally the same manner as in the above-described preferred embodiment. The particular designated region and particular level adjusting amount set for each of the display windows w1 are stored into a buffer memory, so that, next time the window is selected, the window w1 is displayed in accordance with the last settings.

In response to the selection of the display window w1, the level change section 170 extracts frequency components included in the designated region on the basis of the particular designated region and particular level adjusting amount set for the selected display window, and then it adjusts amplitude levels of the extracted frequency components. The amplitude level adjustment by the level change section 170 may be performed in any one of the following two methods: i.e. a method in which the amplitude level adjustment is performed in accordance with settings of only the selected one display window w1; and a method in which the amplitude level adjustment is performed in accordance with a combination of settings of the plurality of display windows w1. Further, the latter method includes serial signal processing (i.e., serial combination method) and parallel signal processing (i.e., parallel combination method).

The windows w1 corresponding to the individual tabs wt1, wt2, . . . may either display content, like the one in the above-described preferred embodiment, which is to be subjected to signal processing in parallel on a tab-by-tab basis, or display content which is to be subjected to signal processing in series. Further, an arrangement may be made such that signal processing is performed in accordance with displayed content of the window w1 corresponding to the selected tab while signal processing based on displayed content of the window w1 corresponding to the non-selected tab is not performed. In such a case, by sequentially switching the tab selection among the tabs to thereby check content of individual sounds, the user can sequentially check achievable acoustic effects based on the displayed content of the windows w1 corresponding to the tabs and thereby easily compare the achievable acoustic effects. In the case where the signal processing is performed in parallel on the tab-by-tab basis, the signal processing section 100 may be constructed in such a manner that audio signals obtained through the parallel signal processing are output after being mixed together. At that time, a mixing ratio of the audio signals may be controlled in accordance with an instruction given by the user. Note that the audio signals to be processed in parallel (i.e., through parallel signal processing) may be either audio signals of a same music piece or audio signals of different music pieces.

The following explain the signal processing performed in series (i.e., serial signal processing). First, the level change section 170 performs signal processing on audio signals, acquired by the acquisition section 110, in accordance with displayed content on the window w1 corresponding to the tab wt1. Then, further signal processing is performed on the audio signals, having been subjected to the signal processing, in accordance with displayed content on the window w1 corresponding to the tab wt2. Namely, the signal processing performed in series means further processing the results of the signal processing, based on the displayed content on the window w1 corresponding to one tab w1, on the basis of displayed content on the window w1 corresponding to another tab.

In the case where the audio signals are processed in series like this, the display style of the window w1 corresponding to the tab wt2 may be arranged as shown in FIG. 11B. In this example, designated regions s1 and s2 are set as shown in FIG. 11A, and let it be assumed here that adjusting amounts are set for the designated regions s1 and s2 in such a manner as to remove sounds included in the designated regions s1 and s2. Thus, in this case, a display having removed therefrom sound image calculation results corresponding to the designated regions s1 and s2 is presented on the window w1 corresponding to the tab wt2. Further, on the basis of the displayed content on the window w1 corresponding to the tab wt2, the user performs region designating operation for setting another designated region s3.

Note that both the aforementioned parallel signal processing and the aforementioned serial signal processing may be employed. For example, relationship between the tabs wt1 and wt2 may be such that the signal processing corresponding to the tabs wt1 and wt2 is performed in series, and relationship between the tabs wt1 and wt2 and the tab wt3 may be such that the signal processing corresponding to the tab wt3 is performed in parallel with the signal processing corresponding to the tabs wt1 and wt2. Furthermore, the windows w1 corresponding to the individual tabs may be displayed concurrently in parallel on the display screen 131.

<Modification 6>

The above-described preferred embodiment may be modified in such a manner that the display control section 140 displays, in the designated region displayed on the window w1, an adjusting amount (referred to as "setting adjusting amount" in modification 6) set for the designated region. The following describe an example of such a display with reference to FIG. 12.

Figure 12A:
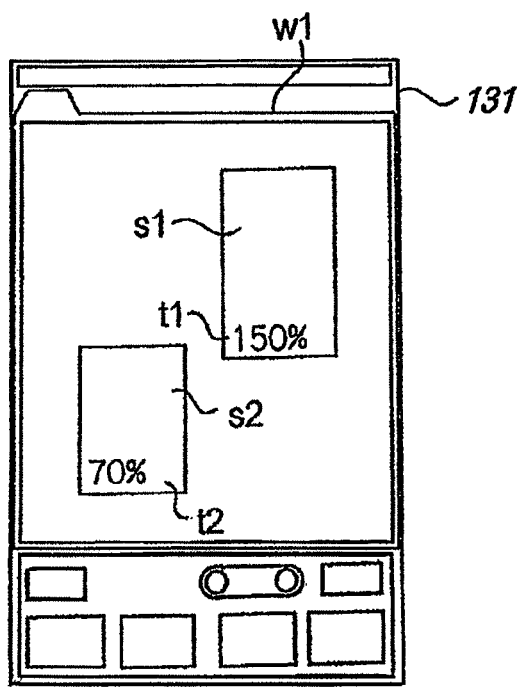
FIGS. 12A and 12B are diagrams explanatory of example displays on the display screen in modification 6 of the present invention.
Figure 12B:
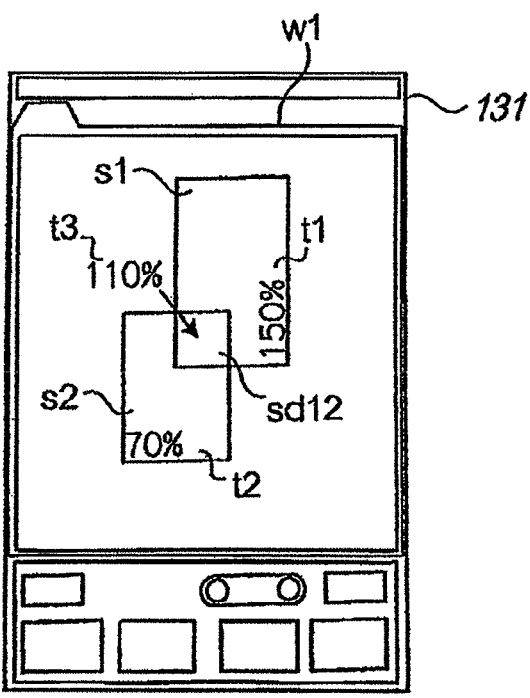

FIG. 12 is explanatory of the example display presented on the display screen 131 in modification 6. As shown in FIG. 12A, the display control section 140 displays setting adjusting amounts t1 and t2 in the respective designated region s1 and s2. Once the user positions the designated regions s1 and s2 in a manner as shown in FIG. 12B, for example, by moving the designated region s1 and s2, the display control section 140 moves the setting adjusting amount t1 to a non-overlapping region where the adjusting amount t1 does not overlap the designated region s2 and displays the setting adjusting amount t1 in that non-overlapping region. Further, the display control section 140 displays a setting adjusting amount t3, set for an overlapping region sd12 created by the movement of the designated region s1 and s2, outside the overlapping region sd12 because the setting adjusting amount t3 cannot be displayed in the region sd12.

Note that, in each of the designated regions, information indicative of a designated frequency range and designated sound image range set for that designated region may also be displayed.

Further, a displayed position of any one of the setting adjusting amounts may be changed in accordance with a position of the touch sensor 12 which the user is touching (such a position will be referred to as "touched position" in modification 6). More specifically, the display control section 140 displays the setting adjusting amount at a position a predetermined distance from the touched position. In this way, it is possible to prevent the setting adjusting amount from becoming invisible during user's operation.

<Modification 7>

Whereas the preferred embodiment has been shown and described above in relation to the case where the designated region has a rectangular shape, the designated region may have any other desired shape, such as a circular, elliptical, triangular or other polygonal shape. Namely, the user may select and determine any desired shape of the designated region from among a plurality of shapes prepared in advance. Alternatively, the user may designate any desired shape by tracing a region which the user wants to set as the designated region.

Figure 13:
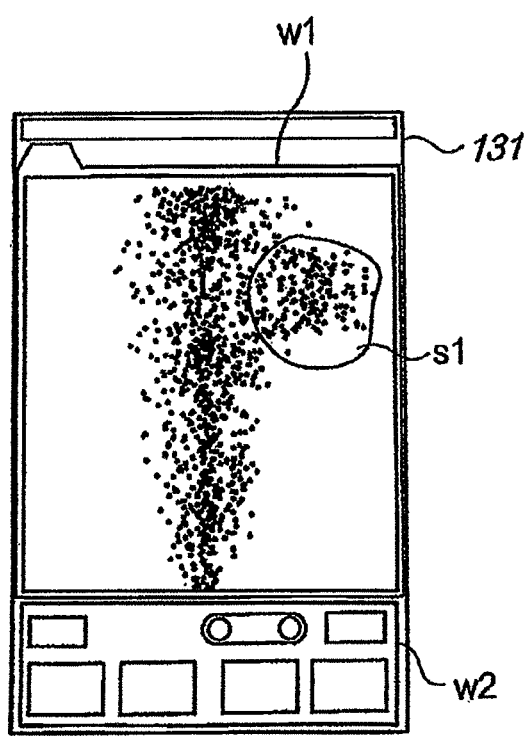
FIG. 13 is a diagram explanatory of a designated region set in modification 7 of the present invention.

FIG. 13 is a diagram explanatory of a designated region set in modification 7. The designated region s1 shown in FIG. 13 has an example of a shape drawn by the user tracing the surface of the touch sensor 121 in a desired trajectory corresponding to the shape of the region s1. If the shape of the designated region s1 is other than a rectangular shape, it is not possible to determine a designated frequency range and a designated sound image range as in the above-described embodiment, but frequency values to be extracted can be determined by the level change section 170 acquiring coordinates information, identifying the shape of the designated region s1, to thereby identify frequency-value-by-frequency-value designated sound image ranges.

Note that, whereas the region setting section 150 has been described above as setting, as the designated region, an inside portion of a particular region designated by the user, an inside portion of the region designated by the user may be set as the particular designated region.

<Modification 8>

The above-described preferred embodiment may be modified in such a manner that the display control section 140 displays an inside portion of the designated region in a display style corresponding to the adjusting amount set for the designated region. For example, the display control section 140 may display the inside portion of the designated region in such a manner that the adjusting amount set for the designated region is indicated by a particular color, color density, transmission amount, pattern variation, or the like corresponding to that adjusting amount. Further, for sound image calculation results displayed within the designated region, the display control section 140 may change a display style of each dot or point in accordance with the adjusting amount set for the designated region.

<Modification 9>

The preferred embodiment has been described above in relation to the case where the first conversion section 120 extracts an amplitude level (magnitude) of each frequency value (frequency component) as a frequency-dependent feature amount, and where the sound image calculation section 130 calculates a relation value indicative of relationship in amplitude level between the channels. However, the frequency-dependent feature amount and the relation value may be of other content than the aforementioned. For example, the frequency-dependent feature amount may be a phase of each frequency value, and the relation value may be a phase difference between the channels. In such a case, the display control section 140 may control displayed content with the sound image position coordinate axis of the coordinate system, used for displaying on the window w1, replaced with a phase difference coordinate axis.

<Modification 10>

Whereas the preferred embodiment has been described above in relation to the case where the acquisition section 110 acquires audio signals of two stereo channels, the acquisition section 110 may acquire audio signals of three or more channels, such as 5.1 channels. In such a case, the sound image position calculation section 130 prestores a mathematical expression for calculating relation values representative of relationship in amplitude level between the channels, in association with individual frequency values and on the basis of amplitude levels of all of the channels. Such a mathematical expression may be one for calculating, on the basis of differences between amplitude levels of the channels, sound image positions (relation values), represented by directions as viewed from a listening position (e.g., angles within a horizontal plane that are determined with a particular direction used as a reference) when amplitude levels have been output from speakers installed in accordance with a particular standard (such as ITU-R BS.775-1 or the like).

Then, the sound image position calculation section 130 may use the prestored mathematical expression to calculate relation values corresponding to the individual frequency values and output information indicative of the calculation results. In this case, the display control section 140 may control displayed content with the sound image position coordinate axis of the coordinate system, used for displaying on the window w1, replaced with a relation value coordinate axis.

Note that, when audio signals of three or more channels have been received, the acquisition section 110 may output the audio signals after mixing down the audio signals to two channels or by extracting particular two channels from the three or more channels.

<Modification 11>

Whereas the preferred embodiment has been described above in relation to the case where the region setting section 150 sets, as the designated region, a region designated by the user operating the touch sensor 121, the designated region may be set in any other suitable manner. For example, a plurality of pieces of designated region specifying information that define respective ranges of designated regions may be prestored in a memory in association with various different designated regions so that, in response to a user's instruction or the like, the region setting section 150 acquires any one of the pieces of designated region specifying information from the memory and sets the designated region on the basis of the acquired designated region specifying information.

Note that the designated region specifying information may be defined in such a manner that a range of the designated region varies in accordance with the passage of time. The variation of the range of the designated region means variation of the shape of the designated region, variation of the position (movement) of the designated region, and/or the like. In this case, the region setting section 150 may set, as the designated region, the range varying in accordance with the passage of time. Content of the variation may be determined by analyzing the audio signals. For example, if the audio signals are of a music piece, a tempo of the music piece may be detected from time-serial variation in sound volume of the audio signals etc. so that the designated region specifying information is defined in such a manner that a style of the movement or the shape of the designated region varies in accordance with the detected tempo. Alternatively, the designated region specifying information may be defined in such a manner that it varies in accordance with sound image calculation results. For example, the designated region specifying information may be defined in such a manner that, in a distribution of points indicative of sound image positions expressed as sound image calculation results, a range, other than the sound image localization center, where the points are located (or gather) with more than predetermined density is set as a designated region. Alternatively, the designated region specifying information may be defined in such a manner that a range where the points are located (or gather) with more than predetermined density is set as a designated region without the sound image localization center being excluded.

Namely, the designated region specifying information may be of any desired form as long as it is defined in accordance with a predetermined algorithm, and it may be an algorithm that randomly changes the range of the designated region in accordance with generated random numbers.

As another alternative, the region setting section 150 may set a designated region in accordance with a movement or motion signal output from the posture detection section 15. For example, if there is already a designated region set through user's operation, the designated region may be caused to move in response to the user inclining or swinging the terminal 1. For example, as the terminal 1 is inclined in such a manner that the right side of the display screen 131 approaches the ground surface, the region setting section 150 may move rightward the designated region that is to be set.

<Modification 12>

Whereas the preferred embodiment has been described above in relation to the case where the display control section 140 displays sound image calculation results on the window w1 of the display screen 131 using the coordinate system having two axes, i.e. frequency coordinate axis and sound image coordinate axis, the display control section 140 may display sound image calculation results on the window w1 using a coordinate system having more axes. For example, in the case where a relation values corresponding to a frequency value also includes a phase difference as in modification 9, the display control section 140 may use a coordinate system having three axes, i.e. frequency coordinate axis, sound image coordinate axis and phase difference coordinate axis.

In the case where the display control section 140 displays sound image calculation results on the window w1 using the coordinate system having three axes as above, the display using the coordinate system having three axes may be replaced with two displays, such as a display using a coordinate system having a frequency coordinate axis and sound image coordinate axis and a display using a coordinate system having a frequency coordinate axis and phase difference coordinate axis, or the display control section 140 may display a graphic showing a three-axis coordinate system in a pseudo manner. Further, if the display screen 131 is a stereoscopic display, the display control section 140 may display a graphic showing a three-axis coordinate system in a stereoscopic fashion.

Further, in the case where the three-axis coordinate system is shown, the user may designate a region to be set as the designated region in a state where sound image calculation results are displayed with the three-axis coordinate system temporarily replaced with a two-axis coordinate system.

<Modification 13>

The control program employed in the above-described embodiment may be supplied stored in a computer-readable recording medium, such as a magnetic recording medium (such as a magnetic tape, magnetic disk or the like), opto-magnetic recording medium or semiconductor memory. Alternatively, the terminal 1 may download the control program via a network.

This application is based on, and claims priorities to, Japanese patent application No. 2011-025402 filed on 8 Feb.

2011. The disclosure of the priority application, in its entirety, including the drawings, claims, and the specification thereof, are incorporated herein by reference.

What is claimed is:

1. A signal processing apparatus comprising:
   an acquisition section which acquires audio signals of individual ones of a plurality of channels;
   a first conversion section which converts the audio signal of each of the channels, acquired by said acquisition section, into a frequency spectra set of the channel;
   a calculation section which extracts frequency-dependent feature amounts from the acquired audio signals and calculates, in correspondence with each frequency component, a relation value corresponding to relationship in the feature amount between the channels;
   a display control section which displays results of calculation by said calculation section by use of a coordinate system having a frequency coordinate axis and a coordinate axis of the relation value;
   a region setting section which sets a partial region of the coordinate system as a designated region;
   an adjusting amount setting section which sets a level adjusting amount for the designated region;
   a level change section which extracts, from the results of calculation, frequency components included in the designated region and changes amplitude levels of the extracted frequency components of the frequency spectra in accordance with the adjusting amount; and
   a second conversion section which synthesizes the frequency spectra, having been changed in the amplitude level by said level change section, for each of the channels and converts the synthesized frequency spectra into an audio signal of the channel,
   wherein said display control section is capable of selectively displaying any of a plurality of display windows on the display screen, each of the display windows displaying the results of calculation by said calculation section, and
   wherein, for each of the display windows, a particular designated region can be set by said region setting section, and a particular level adjusting amount can be set by said adjusting amount setting section in association with the particular designated region.

2. The signal processing apparatus as claimed in claim 1, wherein said region setting section sets a plurality of regions as a plurality of the designated regions, and said adjusting amount setting section sets the adjusting amounts for individual ones of the plurality of the designated regions, and
   wherein, if there is an overlapping region that overlaps the plurality of the designated regions, said level change section changes amplitude levels of frequency components, included among the extracted frequency components and included in the overlapping region, in accordance with an amount determined on the basis of at least one of the adjusting amounts set for the individual designated regions constituting the overlapping region.

3. The signal processing apparatus as claimed in claim 2, wherein said level change section changes the amplitude levels of the frequency components, included in the overlapping region, in accordance with an amount determined by the adjusting amounts set for the individual designated regions and content of the results of calculation included in the individual designated regions.

4. The signal processing apparatus as claimed in claim 2, wherein said level change section changes the amplitude levels of the frequency components, included in the overlapping region, in accordance with an amount determined by the adjusting amounts set for the individual designated regions and relationship between respective sizes of the designated regions.

5. The signal processing apparatus as claimed in claim 1, wherein said adjusting amount setting section sets the adjusting amount such that the adjusting amount differs depending on positions within the designated region.

6. The signal processing apparatus as claimed in claim 1, wherein said frequency-dependent feature amount is an amplitude level of each of the frequency components included in the frequency spectra, and said relation value corresponding to the relationship in the feature amount between the channels is indicative of a sound image position of each of the frequency components that is determined by correlation, in the amplitude level of each of the frequency components, between the channels.

7. The signal processing apparatus as claimed in claim 1, wherein said display control section performs control to display, on the display screen, symbolic graphics each identifying one coordinate position of the coordinate system that is determined by a frequency value of one of the frequency components and the relation value corresponding to the frequency component.

8. The signal processing apparatus as claimed in claim 7, wherein said symbolic graphics each identifying one coordinate position of the coordinate system are each any one of a dot, a line and a particular mark.

9. The signal processing apparatus as claimed in claim 7, wherein the coordinate system is represented by a plurality of meshed regions, and said symbolic graphics each identifying one coordinate position of the coordinate system are each in a form of a display identifying one of the plurality of meshed regions.

10. The signal processing apparatus as claimed in claim 7, wherein, in addition to said symbolic graphics each identifying one coordinate position of the coordinate system, a display reflecting an amplitude level of a frequency component corresponding to the coordinate position is presented on the display screen.

11. The signal processing apparatus as claimed in claim 10, wherein said display reflecting an amplitude level comprises changing at least one of lightness, colorfulness, brightness and size of the symbolic graphic.

12. The signal processing apparatus as claimed in claim 1, wherein said region setting section is constructed to allow a user to set a desired said designated region.

13. The signal processing apparatus as claimed in claim 12, wherein said region setting section is constructed to allow the user to set the desired designated region by the user operating a graphic indicative of a designated region displayed on the display screen.

14. The signal processing apparatus as claimed in claim 1, wherein said region setting section prestores designated region identifying information that defines a predetermined range of a designated region, and said region setting section is constructed to retrieve the prestored designated region identifying information to set the designated region based on the retrieved designated region identifying information.

15. The signal processing apparatus as claimed in claim 1, wherein said region setting section prestores templates of a plurality of designated regions each preset to designate a predetermined frequency range, and said region setting section sets, in response to selection of any one of the templates, the designated region corresponding to the selected template.

16. The signal processing apparatus as claimed in claim 15, wherein the templates are provided in corresponding relation to musical instrument types so that, in response to selection of a particular one of the musical instrument types, any one of the templates corresponding to the selected particular musical instrument type is selected.

17. The signal processing apparatus as claimed in claim 1, wherein said display control section performs control such that a number of frequency components related to individual ones of the relation values or a distribution of levels of the frequency components related to the individual relation values is displayed on the display screen in a histogram format having a horizontal axis representing a coordinate axis of the relation values and having a vertical axis representing the frequency coordinate axis.

18. The signal processing apparatus as claimed in claim 1, wherein, in response to selection of the display window to be displayed on the display screen and on the basis of the particular designated region and the level adjusting amount set for the selected display window, said level change section extracts frequency components included in the particular designated region and adjusts the amplitude levels of the extracted frequency components.

19. The signal processing apparatus as claimed in claim 18, wherein, on the basis of the particular designated region and the level adjusting amount set for one selected display window, said level change section extracts the frequency components included in the particular designated region and adjusts the amplitude levels of the extracted frequency components.

20. The signal processing apparatus as claimed in claim 18, wherein, on the basis of a combination of the particular designated regions and the level adjusting amounts set for a plurality of selected display windows, said level change section extracts the frequency components included in the particular designated regions and adjusts the amplitude levels of the extracted frequency components.

21. The signal processing apparatus as claimed in claim 20, wherein said combination is at least one of a serial combination and a parallel combination.

22. The signal processing apparatus as claimed in claim 1, wherein said display control section displays, on the display screen, a graphic indicative of the designated region and the level adjusting amount in association with the graphic.

23. The signal processing apparatus as claimed in claim 1, wherein said display control section displays, on the display screen, a graphic indicative of the designated region in a display style corresponding to the level adjusting amount.

24. The signal processing apparatus as claimed in claim 1, wherein said region setting section sets the designated region by drawing a graphic, defining a desired region, with a desired trajectory in response to user's operation.

25. The signal processing apparatus as claimed in claim 1, wherein said region setting section sets the designated region in such a manner that the designated region varies in accordance with passage of time.

26. The signal processing apparatus as claimed in claim 25, wherein the designated region varies in predetermined order or randomly in accordance with passage of time.

27. The signal processing apparatus as claimed in claim 1, wherein a transparent touch sensor is provided over the display screen, and setting is performed in at least one of said region setting section and said adjusting amount setting section by use of user's operation of the touch sensor.

28. The signal processing apparatus as claimed in claim 1, which is accommodated in a casing in such a manner that the signal processing apparatus can be held by a user's hand, the display screen being disposed on a front surface of the casing, which further comprises a posture detector, and
wherein said display control section displays, on the display screen, a graphic indicative of the designated region, and moves the graphic indicative of the designated region on the display screen in response to inclining or swinging motion of the casing detected by the posture detector, the designated region being changed in response to movement of the graphic on the display screen.

29. A computer-implemented method comprising:
an acquisition step of acquiring audio signals of individual ones of a plurality of channels;
a step of converting the audio signal of each of the channels, acquired by said acquisition section, into a frequency spectra set of the channel;
a calculation step of extracting frequency-dependent feature amounts from the acquired audio signals and calculating, in correspondence with each frequency component, a relation value corresponding to relationship in the feature amount between the channels;
a step of displaying results of calculation by said calculation step by use of a coordinate system having a frequency coordinate axis and a coordinate axis of the relation value;
a step of setting a partial region of the coordinate system as a designated region;
a step of setting a level adjusting amount to be used for the designated region;
a level change step of extracting, from the results of calculation, frequency components included in the designated region and changing amplitude levels of the extracted frequency components of the frequency spectra in accordance with the adjusting amount; and
a step of synthesizing the frequency spectra, having been changed in the amplitude level by said level change step, for each of the channels and converting the synthesized frequency spectra into an audio signal of the channel,
wherein said step of displaying is capable of selectively displaying any of a plurality of display windows on the display screen, each of the display windows displaying the results of calculation by said calculation step, and
wherein, for each of the display windows, a particular designated region can be set by said step of setting a partial region, and a particular level adjusting amount can be set by said step of setting a level adjusting amount in association with the particular designated region.

30. A non-transitory computer-readable medium containing a program for causing a processor to execute the steps of:
an acquisition step of acquiring audio signals of individual ones of a plurality of channels;
a step of converting the audio signal of each of the channels, acquired by said acquisition section, into a frequency spectra set of the channel;
a calculation step of extracting frequency-dependent feature amounts from the acquired audio signals and calculating, in correspondence with each frequency component, a relation value corresponding to relationship in the feature amount between the channels;
a step of displaying results of calculation by said calculation step by use of a coordinate system having a frequency coordinate axis and a coordinate axis of the relation value;
a step of setting a partial region of the coordinate system as a designated region;
a step of setting a level adjusting amount to be used for the designated region;
a level change step of extracting, from the results of calculation, frequency components included in the designated region and changing amplitude levels of the extracted frequency components of the frequency spectra in accordance with the adjusting amount; and a step of synthesizing the frequency spectra, having been changed in the amplitude level by said level change step, for each of the channels and converting the synthesized frequency spectra into an audio signal of the channel, wherein said step of displaying is capable of selectively displaying any of a plurality of display windows on the display screen, each of the display windows displaying the results of calculation by said calculation step, and wherein, for each of the display windows, a particular designated region can be set by said step of setting a partial region, and a particular level adjusting amount can be set by said step of setting a level adjusting amount in association with the particular designated region.

* * * * *